United States Patent [19]

Allen et al.

[11] Patent Number: 5,399,917
[45] Date of Patent: Mar. 21, 1995

[54] HIGH VOLTAGE TOLERANT SWITCH CONSTRUCTED FOR A LOW VOLTAGE CMOS PROCESS

[75] Inventors: Michael J. Allen, Rescue; Charles H. Lucas, Fair Oaks, both of Calif.

[73] Assignee: Intel Corporation, Santa Clara, Calif.

[21] Appl. No.: 42,045

[22] Filed: Mar. 31, 1993

[51] Int. Cl.⁶ .................. H01L 29/78; G06F 1/26
[52] U.S. Cl. ..................... 327/436; 257/334; 257/350; 257/365; 257/371; 327/581; 327/530; 327/543
[58] Field of Search ............ 307/296.1, 304, 264, 307/607, 296.8, 482, 578; 257/334, 350, 365, 371

[56] References Cited

U.S. PATENT DOCUMENTS 4,119,996  10/1978  Jhabvala ............... 257/334
5,274,828  12/1993  McAdams ............... 395/750

*Primary Examiner*—William L. Sikes
*Assistant Examiner*—Fetsum Abraham
*Attorney, Agent, or Firm*—Blakely, Sokoloff, Taylor & Zafman

[57] ABSTRACT

An integrated circuit which includes a pair of serially arranged P channel transistor devices connected with their source and drain terminals in series. The devices are constructed as N well devices in a P substrate. Using a pair of N well devices allows higher voltages to be divided and applied across the two devices without reaching the breakdown limits of either the oxide or the junctions between different portions of the devices used in the process. These devices have been found capable of transferring ten or more volts to circuitry for programming or erasing flash EEPROM cells even the they are a part of integrated circuitry designed for only 3.3 volt usage.

10 Claims, 1 Drawing Sheet

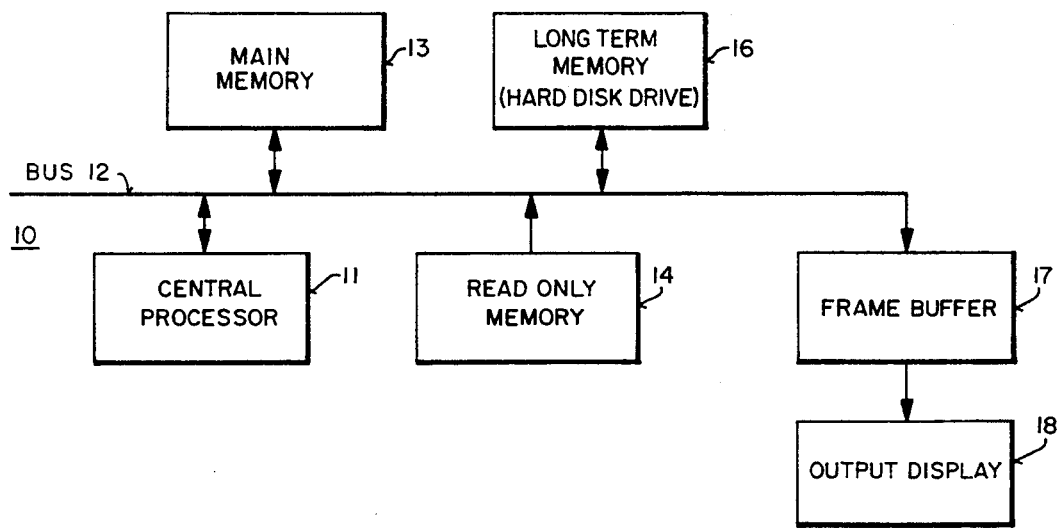
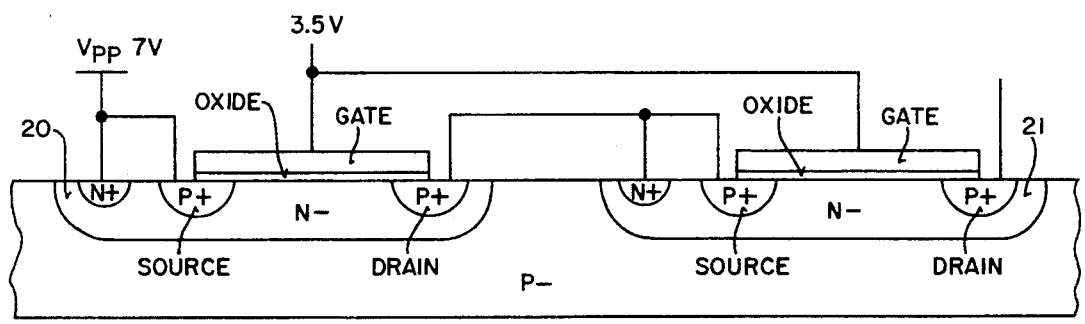
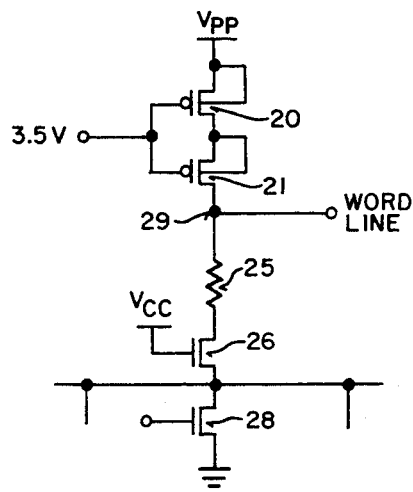
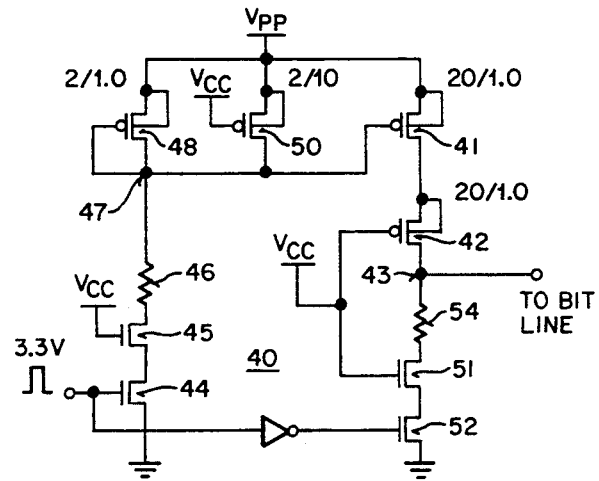

HIGH VOLTAGE TOLERANT SWITCH CONSTRUCTED FOR A LOW VOLTAGE CMOS PROCESS

BACKGROUND OF THE INVENTION

1. Field of the Invention

This invention relates to computer systems and, more particularly, to methods and apparatus for switching high voltages in circuitry manufactured by processes typically used to provide low voltage tolerant integrated circuitry.

2. History of the Prior Art

A major trend in the manufacture of personal computers is toward portable computers which are able to provide most of the abilities of desktop computers but are packaged in a very small and light package. In order to accomplish this, such portable computers must provide the large storage capacity and the processor speed necessary to run large programs. A typical prior art portable computer uses a great deal of power in order to meet these requirement.

At the same time, computer designers are modifying the components used in such portable computers so that the computers are able to run for long periods while consuming very small amounts of power. In order to reduce power consumption and extend battery life, much of the integrated circuitry used in portable computers is being redesigned to run at low voltage levels. This reduces the power usage and allows more components to be placed closer to one another in the circuitry. The modern circuitry and components used in portable computers are being designed to operate at 3.3 volt levels. This helps a great deal to reduce the power needs of portable computers. However, at the same time, the desire to make portable computers offer all of the advantages of desktop computers opposes this salutary result. Many of the advantages offered by desktop computers require higher voltages to function. For example, one real convenience is the ability to change the BIOS processes as improvements in the computer or its peripherals occur. Historically, this has been accomplished by removing the EPROM or similar circuitry providing the read only memory for storing the BIOS processes and replacing it with new circuitry. This is a complicated operation beyond the abilities of many computer users. Recently, flash EEPROM memory has been used to store BIOS processes. This memory may be reprogrammed without removing the BIOS circuitry from the computer by running a small BIOS update program to reprogram the circuitry when the BIOS processes change. However, reprogramming flash EEPROM memory requires from seven to twelve volts to accomplish. The integrated circuits designed for low voltage use are not able to tolerate such high voltages without physical damage.

Another form of flash EEPROM memory array provides another example of high voltage requirements in portable computers. Recently, a new form of long term random access storage has been devised using flash EEPROM memory arrays. These arrays provide the a smaller lighter functional equivalent of a hard disk drive which operates more rapidly and is not as sensitive to physical damage. Such memory arrays are especially useful in portable computers where space is at a premium and weight is extremely important. However, these flash EEPROM memory arrays also require much higher voltages for writing and erasing data than can be tolerated by prior art integrated circuitry adapted to operate at low voltages. Consequently, portable computers using low voltage circuitry have not been able to utilize these modern advantages.

SUMMARY OF THE INVENTION

It is, therefore, an object of the present invention to provide integrated circuitry by which various circuit operations requiring high voltage may be carried out using integrated circuitry which is designed for low voltage operations.

It is another, more specific, object of the present invention to provide a circuit for switching high voltages to program a memory array in integrated circuitry designed for low voltage usage.

These and other objects of the present invention are realized in an integrated circuit which includes a pair of serially arranged P channel transistor devices connected with their source and drain terminals in series and designed to be used to switch high voltages in an integrated circuit designed for a low voltage operations. The devices are constructed as N well devices in a P substrate. Using a pair of IN well devices allows higher voltages to be divided and applied across the two devices without reaching the breakdown limits of either the oxide or the junctions between different portions of the devices used in the process. These devices have been found capable of transferring ten or more volts to circuitry for programming or erasing flash EEPROM cells even though the devices are a part of integrated circuitry designed for only 3.3 volt usage.

These and other objects and features of the invention will be better understood by reference to the detailed description which follows taken together with the drawings in which like elements are referred to by like designations throughout the several views.

BRIEF DESCRIPTION OF THE DRAWINGS

FIG. 1 is a block diagram illustrating a computer system including the present invention.

FIG. 2 is a cross-sectional drawing illustrating a side view of the construction of a pair of transistor devices which may be used in accordance with the present invention.

FIG. 3 is a circuit diagram illustrating a first arrangement in accordance with the invention for switching high voltages in an integrated circuit designed for low voltages.

FIG. 4 is a circuit diagram illustrating a second arrangement in accordance with the invention for switching high voltages in an integrated circuit designed for low voltages.

Notation And Nomenclature

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to apparatus for operating a computer in processing electrical or other (e.g. mechanical, chemical) physical signals to generate other desired physical signals.

DETAILED DESCRIPTION OF THE INVENTION

Referring now to FIG. 1, there is illustrated a computer system 10. The system 10 includes a central processor 11 which carries out the various instructions provided to the computer 10 for its operations. The central processor 11 is joined to a bus 12 adapted to carry information to various components of the system 10. Joined to the bus 12 is main memory 13 which is typically constructed of dynamic random access memory arranged in a manner well known to those skilled in the prior art to store information during a period in which power is provided to the system 10. Also joined to the bus 12 is read only memory 14 which may include various memory devices well known to those skilled in the art which are adapted to retain a particular memory condition in the absence of power to the system 10. The read only memory 14 typically stores various basic functions used by the processor 11 such as basic input/output processes and startup processes typically referred to as BIOS processes. Such memory 14 may be constructed of flash EEPROM memory cells adapted to be modified as various ones of the BIOS processes used by a particular computer are changed. If the memory 14 is constructed of flash EEPROM memory cells, it may be modified by running an update process on the computer itself to reprogram the values stored in the memory 14.

Also connected to the bus 12 are various peripheral components such as long term memory 16. The construction and operation of long term memory 16 (typically electro-mechanical hard disk drives) is well known to those skilled in the art. However, rather than the typical electro-mechanical hard disk drive, a flash EEPROM memory array may be used as the long term memory 16. Such flash EEPROM memory arrays are programmed and erased through techniques which utilize voltages greater than the 3.3 volts available to the integrated circuits of more advanced portable computers. Also joined to the bus 12 is circuitry such as a frame buffer 17 to which data may be written which is to be transferred to an output device such as a monitor 18 for display.

FIG. 2 is a cross-sectional view of two transistor devices 20 and 21 designed in accordance with the present invention. These devices 20 and 21 may be constructed in a manufacturing process which utilizes conventional CMOS techniques. The present invention is adapted to be used with such a process which is designed to provide circuitry constructed to function at low power levels. Such circuitry typically includes integrated circuits basically comprised of N channel field effect transistor devices capable of running at source voltages of 3.3 volts. A manufacturing process of this sort typically provides oxide insulating coatings which are approximately 70 angstroms in thickness. Such coatings are able to withstand voltages of approximately five volts without being subject to electron tunneling which tends to break down and destroy the oxide layer and the effectiveness of the devices. This level of voltage is relatively low compared to the voltages of from seven to twelve volts used to program and erase flash EEPROM memory arrays.

Not only is the voltage tolerance of the oxide layers of such circuitry much lower than the voltages required to program and erase flash EEPROM memory arrays, a manufacturing process of this sort produces semiconductor junctions which are able to withstand various levels of breakdown voltages which are less than the voltages required to program and erase flash EEPROM memory arrays. The various levels of breakdown voltages at semiconductor junctions produced by such a process depend on the particular doping of the layers and the abruptness of the junction profile. For example, a junction in which both the N and P regions are highly doped produces a sharp N+ to P+ junction between regions may be able to withstand voltages of only from a few volts without breakdown. A junction between N+ and P− regions, on the other hand, may be able to withstand voltages of from seven to nine volts without breakdown, while a junction between N− and P− regions may be able to withstand voltages of approximately 20 volts.

Thus, various circuitry which uses flash EEPROM memory devices and is especially useful in portable computers requires from seven to twelve volts for portions of its operation. However, the flash EEPROM memory devices must be a part of integrated circuits which are designed to operate at 3.3 volts and suffer both oxide breakdown and junction breakdown at voltages which are lower than the erase and program voltages of the flash EEPROM arrays. The typical N channel field effect transistor devices produced by the process described above utilize N+ source and drain connections in a P− substrate; and such devices have an upper limit of seven to nine volts before breakdown However, the flash EEPROM memory arrays are very light in weight, store a great deal of data in a very small space, are not subject to many of the mechanical hazards of hard disk drives, and are much more error free than are hard drives. Consequently, it is very desirable that novel adaptations be found which allow their use in arrangements with low voltage integrated circuitry. An example of a flash EEPROM memory array which may be used in place of a hard disk drive is given in U.S. patent application Ser. No. 07/969,131, entitled A Method and Circuitry For A Solid State Memory Disk, S. Wells, filed Oct. 31, 1992, and assigned to the assignee of the present invention.

As may be seen in FIG. 2, each of the devices is placed in a separate N− well in the basic P− type silicon material. Each of the devices includes a P+ type volume in the N− well defining a source, a P+ type volume in the N− well defining a drain, a layer of silicon-dioxide insulating material, and a gate terminal separated from the surface of the well (including the surfaces of the well which include the source and drain) by the silicon-dioxide insulating material. Each of the devices has a body tap of N+ polarity formed in the N− well. A conductor from a source of high voltage which may be used for programming flash EEPROM devices joins to the body tap and to the source terminal. The drain terminal of one device is joined to the body tap and the source terminal of the other device. The gate terminals of the two devices are joined together and each gate terminal receives 3.5 volts in an on condition. An N+ integrated circuit resistor is formed in an N− doped region adjacent the first of the devices and may be connected in series with the devices in a manner explained below to help limit current through various N channel devices.

The foregoing arrangement allows a high voltage such as seven volts to be applied at the source terminal of one P channel device 20 and switched to the drain terminal of the other P channel device 21 without producing a voltage larger than that which the integrated circuit is designed to tolerate across any junction between two differently doped regions or across any silicon dioxide layer of the two devices. For example, in the arrangement shown in FIG. 2, the voltage between the gate and source terminals, and thus across the silicon dioxide layer which separates those regions of the devices, can never be greater than 3.5 volts in the conducting condition of the device. Similarly, the voltage between the gate and drain terminals and across the silicon dioxide layer which separates those regions can never be greater than 3.5 volts in the conducting condition of the device. Similarly, except for the N− well to P− substrate which can withstand well above seven volts, the voltage across none of the semiconductor boundaries is greater than from three to four volts, an amount insufficient to cause breakdown of the P+ to N− junctions, during any operating condition of these devices. The total value of Vpp (the voltage of the high voltage source) does not appear across the drain to source terminals of either of the two devices in any condition of the devices as will be seen. Consequently, the devices are well able to handle the high voltages furnished without any breakdown of the junctions or the silicon dioxide insulating layer.

Referring now to FIG. 3, there is illustrated a circuit diagram of a first circuit including the present invention which allows the use of high voltages in circuitry manufactured by a process which usually is used to provide low voltage integrated circuits comprised mainly of N channel devices. In FIG. 3, the two devices 20 and 21 of FIG. 2 are arranged in series with a resistor 25 and a N channel device 26. The drain and source terminals of the N channel device 26 are connected in series with the source and drain terminals of an N channel device 28 between the resistor 25 and ground. The N channel device 28 may be individually selected to choose the path through the particular integrated circuit illustrated in FIG. 3.

The drain terminal of the device 21 is connected to a word line at a node 29 in a flash memory arrangement. In the arrangement shown, the high voltage (seven volts) available from the source Vpp appears at the drain terminal of the device 21 and, consequently, at the word line when a gate voltage of 3.5 volts is applied to the gate terminals of each of the two P channel devices to switch those devices to the conducting condition. This word line voltage must be at least seven volts but need not carry any significant amount of current because the word line is joined to the gate terminals of flash EEPROM devices.

It will be noted that in this condition (as was demonstrated with regard to FIG. 2), no appreciable voltage is dropped between the source and drain terminals of either of the two P channel N well devices 20 and 21. Moreover, the voltage across the oxide layer separating the gate terminal from the P channel in these two N well devices 20 and 21 is at most 3.5 volts.

The N channel devices connected below the node 29 in FIG. 3 receive current which is limited by the current-limiting resistor 25. When the lower N channel device 28 is non-conducting, approximately 4.5 volts appears across the upper N channel device 26; and the voltage at the node between the N channel devices 26 and 28 is approximately 2.5 volts. Thus, approximately 4.5 volts appears across the drain to source terminals of the N channel device 26. This is clearly within the capabilities of that device. Moreover, the N channel device 26 has Vcc (3.3 volts) at its gate terminal so that the voltage across the insulating oxide layer is no greater than 3.7 volts. Seven volts will appear between the drain and the substrate of the device 26 in this condition; but this is well within the N+ to P− junction breakdown level, the well resistor 25 protects the device 26 against accidental current surges. Similarly, only 2.5 volts appears across the drain to source terminals of the N channel device 28, well within its capabilities. Consequently, in the condition in which the devices 20 and 21 are conducting, none of the devices in the circuit see more than approximately 3.5 volts even though a switching voltage of seven volts is used in the circuit. Consequently, no junction sees a voltage drop which would cause breakdown of a junction or an oxide layer.

In the condition in which the N channel device 28 is on, the entire seven volts appears across the pair of devices 20 and 21. However, this is divided between the two P channel devices so no source to drain voltage is higher than 3.5 to four volts. When the node between the two devices 20 and 21 approaches four volts, the device 21 switches off. Consequently, neither device 20 and 21 carries more than four volts between its drain and its source terminals. The gate-to-source and gate-to-drain voltages of these devices in this condition are no more than 3.5 volts. In this condition, no voltage appears across the N channel devices 26 and 28 so their junctions and oxide layers are not stressed.

As was explained above, the circuit of FIG. 3 may be conveniently used to transfer programming voltages to the wordlines of the devices of a flash EEPROM memory array. The circuit including the switch illustrated in FIG. 3 draws some current in the off condition. However, since the wordlines are connected at gate terminals of the flash devices, no significant current flows in the wordline circuit.

FIG. 4 illustrates another circuit 40 designed in accordance with the present invention to allow the use of high voltages on a process designed for lower voltages. The circuit 40 utilizes a pair of N well P channel devices 41 and 42 similar to those illustrated in FIG. 2. These devices are arranged to provide voltage to a bit line at a node 43 of a memory array comprised of flash EEPROM devices. Because the voltage is being furnished to a bit line in which current flows through flash EEPROM devices, it is necessary that a substantial amount of current be furnished in contrast to the circuit of FIG. 3. Typically, only a few bit lines are selected at once while a much larger number remain off. If the switch of FIG. 3 were to be used to select bit lines, then a large number of switches would be drawing current causing the circuit to overheat and limiting the number of bit lines and the size of the array which might be addressed.

The circuit 40 is designed to provide a large current in the on condition and no D.C. current in the off condition of the switch. The circuit 40 includes in addition to the devices 41 and 42, an input N channel device 44 with its source and drain terminals arranged in series with the source and drain terminals of another N channel device 45 and a current limiting resistor 46 between the drain of the device 45 and a node 47. An N Well P channel device 48 is connected to the node 47 and to a source of high voltage Vpp (seven volts in one embodiment). The gate terminal of the device 45 receives a voltage of Vcc so that an input signal of approximately 3.3 volts at the gate terminal of the device 44 turns on the devices 44 and 45 and provides a current path from the source Vpp through the device 48. This is a low current path because of the size of the devices (shown on the figure).

Another P channel N well device 50 is arranged in parallel with the device 48 between the source Vpp and the node 47. The node 47 is joined to the gate terminal of the device 41. The devices 48 and 41 each have their gates and source terminals connected to the same nodes, so they form a current mirror. When the device 44 is turned on, the voltage at the node 47 goes low. Current flows through the device 48, and the device 41 is turned on. The current mirror arrangement with the sizes of the devices 48 and 50 illustrated causes the current through the device 50 to be amplified approximately tens times over that flowing through the device 48. This current flows as well through the other N well device 42 providing the high voltage Vpp and high current at the bit line for transfer to the flash EEPROM devices of the array.

The circuit 40 of FIG. 4 provides the same sort of protection for the various junction and oxide layers as does the arrangement illustrated in FIG. 3. It will be noted that a path through a pair of series connected N channel devices 51 and 52 and a current limiting resistor 54 is off during the condition in which the devices 41 and 42 are on. In this condition, a total of seven volts is distributed across the two devices and the resistor. In the off condition of the switches 41 and 42, no current whatsoever flows in the circuit 40 thus providing the second one of the desired conditions for bit line switching.

Thus, there has been disclosed various arrangements of circuits by which high voltages may be switched in integrated circuits the transistor devices of which are designed for use with much lower voltage levels.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A high voltage switching circuit for use in a low voltage integrated circuit comprising:

a source voltage of a first level;

first and second N well P channel field effect transistors each having source, drain, and gate terminals, the source and drain terminals of each of the first and second P channel field effect transistors being connected in series between the source of voltage of a first level and an output terminal;

means for biasing the first and second P channel transistors whereby voltages less than breakdown voltages appear across junctions between P and N regions and oxide layers of such devices when switching voltages are applied to such transistors;

means for providing an enabling voltage to one of the first and second P channel transistors; and, means for switching the other one of the first and second P channel transistors to a conducting condition.

2. A high voltage switching circuit for use in a low voltage integrated circuit as claimed in claim 1 in which the means for providing an enabling voltage to one of the first and second P channel transistors comprises a first conductor connected to the gate of one of the first and second P channel transistors, and the means for switching the other of the first and second P channel transistors to a conducting condition comprises a second conductor connected to the gate of the other of the first and second P channel transistors and to the first conductor.

3. A high voltage switching circuit for use in a low voltage integrated circuit as claimed in claim 2 further comprising a plurality of N channel field effect transistors at least two of which are joined in series to a source of voltage of a second level, the difference between the first and second levels being greater than the junction breakdown levels of the N and P channel transistors;

means connecting the output terminal to the N channel transistors so that no N channel transistor receives more than one-half of a voltage provided by the source of voltage of a first level.

4. A high voltage switching circuit for use in a low voltage integrated circuit as claimed in claim 3 in which the means connecting the output terminal to the N channel transistors so that no N channel device receives more than one-half of a voltage provided by the source of voltage of a first level comprises a current-limiting resistor.

5. A high voltage switching circuit for use in a low voltage integrated circuit as claimed in claim 1 in which the means for providing an enabling voltage to one of the first and second transistors comprises a first conductor connected to the gate of one of the first and second P channel transistors and to a third source of voltage;

the means for switching the other one of the first and second P channel transistors to a conducting condition comprises a second conductor connected to the gate of the other one of the first and second P channel transistors; and, further comprising a source of input signals to the second conductor.

6. A high voltage switching circuit for use in a low voltage integrated circuit as claimed in claim 5 in which the source of input signals to the second conductor comprises a plurality of N channel field effect transistors at least two of which are joined in series between a source of voltage of a second level and the second input conductor, the difference between the first and second levels of voltage being greater than the junction breakdown levels of the N and P channel transistors;

a third P channel transistor connected between the source of voltage of a first level and the second conductor in a current mirroring arrangement with the other of the first and second P channel transistors having its gate terminal connected to the second conductor, the third P channel transistor being sized such that its drain current is substantially less than the drain current of the other of the first and second P channel transistors.

7. An integrated circuit switch for switching voltages of a first high value in integrated circuits designed for processes utilizing lower source voltages, the switching circuit comprising:

first and second integrated circuit field effect devices;

each of the first and second devices being a P channel device having P+ source and drain areas deposited in a separate N— well of a P— substrate;

each of the first and second devices having a gate area isolated from the N— well by a layer of oxide;

each of the first and second devices including an N+ body area joined to the source area;

the drain of the first device being connected to the source area of the second device;

the source area of the first device being connected to a source of voltage of the first high value;

the gate areas of each of the first and second devices being connected to receive enabling potential approximately one-half of the first high value; and, the drain of the second device being connected to an output terminal.

8. An integrated circuit switch for switching voltages of a first value in integrated circuits designed for processes utilizing lower source voltages as claimed in claim 7 further comprising a plurality of N channel field effect transistors at least two of which are joined in series to a source of voltage of a second value, the difference between the first and second values being greater than junction breakdown levels of the N transistors and the P channel devices; and a current limiting integrated circuit resistor connecting the output terminal to the N channel transistors so that no N channel transistor receives more than one-half of a voltage provided by the source of voltage of a first value.

9. An integrated circuit switch for switching voltages of a first value in integrated circuits designed for processes utilizing lower source voltages as claimed in claim 7 in which the gate area of the second device is directly connected to a source of enabling potential of approximately one-half of the first value, and further comprising a conductor connected to the gate of the first device, and a source of input signals to the conductor.

10. An integrated circuit switch for switching voltages of a first value in integrated circuits designed for processes utilizing lower source voltages as claimed in claim 7 in which the source of input signals to the conductor comprises a plurality of N channel field effect transistors at least two of which are joined in series between a source of voltage of a second value and the conductor, the difference between the first and second values of voltage being greater than the junction breakdown levels of the N channel transistors and the P channel devices; and a third P channel device connected between the source of voltage of a first value and the conductor in a current mirroring arrangement with the first P channel device, the third P channel device being sized such that its drain current is substantially less than the drain current of the drain current of the first P channel device.

* * * * *

UNITED STATES PATENT AND TRADEMARK OFFICE
CERTIFICATE OF CORRECTION

PATENT NO.    :   5,399,917
DATED         :   March 21, 1995
INVENTOR(S)   :   Allen et al.

It is certified that error appears in the above-identified patent and that said Letters Patent is hereby corrected as shown below:

In column 2 at line 24 delete "IN well devices" and insert --N well devices--

Signed and Sealed this

Third Day of December, 1996

Attest:

BRUCE LEHMAN

*Attesting Officer*            *Commissioner of Patents and Trademarks*